(12) United States Patent
Tsai et al.

(10) Patent No.: US 9,728,521 B2
(45) Date of Patent: Aug. 8, 2017

(54) HYBRID BOND USING A COPPER ALLOY FOR YIELD IMPROVEMENT

(71) Applicant: Taiwan Semiconductor Manufacturing Co., Ltd., Hsin-Chu (TW)

(72) Inventors: Yu-Cheng Tsai, Tainan (TW);
Chun-Chieh Chuang, Tainan (TW);
Ching-Chun Wang, Tainan (TW);
Dun-Nian Yaung, Taipei (TW);
Feng-Chi Hung, Chu-Bei (TW);
Chih-Hui Huang, Yongkang (TW);
Yan-Chih Lu, Tainan (TW); Ju-Shi Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/806,888

(22) Filed: Jul. 23, 2015

(65) Prior Publication Data
US 2017/0025381 A1    Jan. 26, 2017

(51) Int. Cl.
*H01L 25/065* (2006.01)
*H01L 23/528* (2006.01)
(Continued)

(52) U.S. Cl.
CPC ...... *H01L 25/0657* (2013.01); *H01L 21/0214* (2013.01); *H01L 21/0217* (2013.01);
(Continued)

(58) Field of Classification Search
CPC ..... H01L 25/0657; H01L 24/25; H01L 24/09; H01L 23/528; H01L 23/53238;
(Continued)

(56) References Cited

U.S. PATENT DOCUMENTS

| 8,809,123 | B2 | 8/2014 | Liu et al. |
| 9,142,517 | B2 * | 9/2015 | Liu .................. H01L 24/80 |
| 2014/0273347 | A1 | 9/2014 | Tseng et al. |

OTHER PUBLICATIONS

Yokogawa, et al. "Role of Impurity Segregation into Cu/Cap Interface and Grain Boundary in Resistivity and Electromigration of Cu/Low-k Interconnects." Japanese Journal of Applied Physics 50 (2011) 05EA02. May 20, 2011.

* cited by examiner

*Primary Examiner* — Caleen Sullivan
(74) *Attorney, Agent, or Firm* — Eschweiler & Potashnik, LLC

(57) ABSTRACT

An integrated circuit (IC) using a copper-alloy based hybrid bond is provided. The IC comprises a pair of semiconductor structures vertically stacked upon one another. The pair of semiconductor structures comprise corresponding dielectric layers and corresponding metal features arranged in the dielectric layers. The metal features comprise a copper alloy having copper and a secondary metal. The IC further comprises a hybrid bond arranged at an interface between the semiconductor structures. The hybrid bond comprises a first bond bonding the dielectric layers together and a second bond bonding the metal features together. The second bond comprises voids arranged between copper grains of the metal features and filled by the secondary metal. A method for bonding a pair of semiconductor structures together using the copper-alloy based hybrid bond is also provided.

20 Claims, 9 Drawing Sheets

(51) Int. Cl.
*H01L 23/532* (2006.01)
*H01L 25/00* (2006.01)
*H01L 23/00* (2006.01)
*H01L 23/522* (2006.01)
*H01L 21/768* (2006.01)
*H01L 21/321* (2006.01)
*H01L 21/311* (2006.01)
*H01L 21/02* (2006.01)

(52) U.S. Cl.
CPC .. *H01L 21/02164* (2013.01); *H01L 21/31111* (2013.01); *H01L 21/3212* (2013.01); *H01L 21/7684* (2013.01); *H01L 21/76807* (2013.01); *H01L 21/76843* (2013.01); *H01L 21/76871* (2013.01); *H01L 21/76877* (2013.01); *H01L 21/76883* (2013.01); *H01L 23/528* (2013.01); *H01L 23/5226* (2013.01); *H01L 23/53238* (2013.01); *H01L 24/80* (2013.01); *H01L 24/89* (2013.01); *H01L 25/50* (2013.01); *H01L 2224/05025* (2013.01); *H01L 2224/05147* (2013.01); *H01L 2224/08145* (2013.01); *H01L 2224/215* (2013.01); *H01L 2224/80895* (2013.01); *H01L 2224/80896* (2013.01); *H01L 2224/94* (2013.01); *H01L 2225/06524* (2013.01); *H01L 2924/0104* (2013.01); *H01L 2924/01013* (2013.01); *H01L 2924/01022* (2013.01); *H01L 2924/01025* (2013.01); *H01L 2924/01027* (2013.01); *H01L 2924/01028* (2013.01); *H01L 2924/01072* (2013.01)

(58) Field of Classification Search
CPC ..... H01L 23/5226; H01L 25/50; H01L 24/82; H01L 24/89; H01L 21/76807; H01L 21/76843; H01L 21/76871; H01L 21/76877; H01L 21/7684; H01L 21/31111; H01L 21/0214; H01L 21/02164; H01L 21/0217; H01L 21/76883; H01L 2224/82897; H01L 2224/24101; H01L 2224/24146; H01L 2224/05147; H01L 2224/05025; H01L 2224/08145; H01L 2924/01013; H01L 2924/01022; H01L 2224/215; H01L 2924/01027; H01L 2924/01025; H01L 2924/0104; H01L 2924/01072; H01L 2225/06541; H01L 2224/80895; H01L 2224/80896; H01L 2224/82896
USPC .......................................................... 257/751
See application file for complete search history.

US 9,728,521 B2

HYBRID BOND USING A COPPER ALLOY FOR YIELD IMPROVEMENT

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The vertical integration of two-dimensional (2D) ICs into three-dimensional integrated circuits (3D ICs) has emerged as a potential approach to improving processing capabilities and power consumption of ICs. By vertically integrating 2D IC into 3D ICs, footprints are reduced and metal interconnect distance is shortened, thereby improving processing capabilities and reducing power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
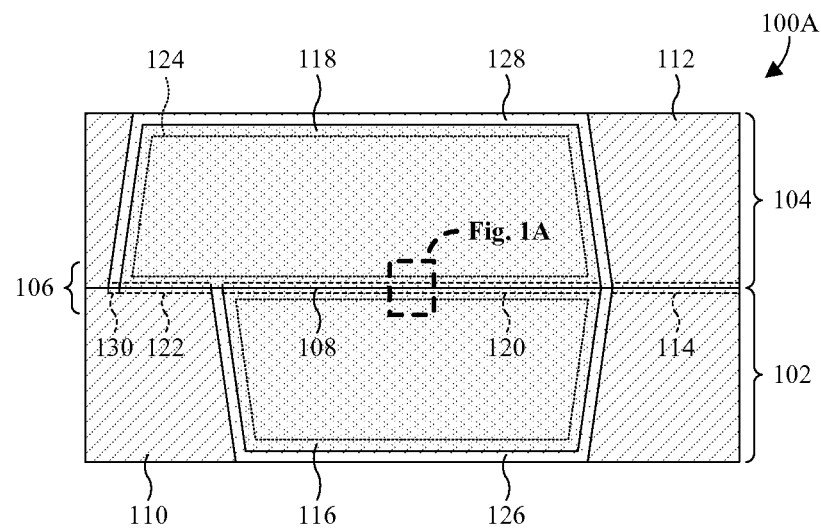
FIG. 1A illustrates a cross-sectional view of some embodiments of a pair of semiconductor structures bonded together by a copper-alloy based hybrid bond.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some three-dimensional (3D) integrated circuits (ICs) are formed by vertically stacking a pair of two-dimensional (2D) ICs. In face-to-face (FTF) stacking, the 2D ICs may then be bonded together through corresponding back end of line (BEOL) metallization stacks using a hybrid bond at an interface between the BEOL metallization stacks. The hybrid bond comprises both a dielectric-to-dielectric bond and a copper-to-copper bond restricted to pure copper. A shortcoming of the hybrid bond is that the copper-to-copper bond suffers from voids (i.e., defects) along the interface between the BEOL metallization stacks and along copper grain boundaries. These voids reduce the size of the manufacturing process window, reduce the reliability of the hybrid bond, and reduce yield according to wafer acceptance testing (WAT).

In view of the foregoing, the present application is directed to a 3D IC comprising a pair of vertically stacked 2D ICs bonded together with a copper-alloy based hybrid bond that remedies the foregoing shortcomings. The hybrid bond comprises a dielectric-to-dielectric bond and a copper-to-copper bond using copper alloys. The copper-to-copper bond may be, for example, a pure-copper-to-copper-alloy bond or a copper-alloy-to-copper-alloy bond. The copper-to-copper bond comprises copper grains having voids along an interface between the 2D ICs, and a secondary metal of the copper alloy filling the voids. Advantageously, filling the voids with the secondary metal increases the size of the process window, increases the reliability of the hybrid bond, and increase yield according to WAT.

With reference to FIG. 1A, a cross-sectional view 100A of some embodiments of a pair of semiconductor structures 102, 104 bonded together by a copper-alloy based hybrid bond 106 is provided. The semiconductor structures 102, 104 are vertically stacked and bonded together by the copper-alloy based hybrid bond 106 at an interface 108, such as a substantially planar interface, between the semiconductor structures 102, 104. The semiconductor structures 102, 104 comprise a lower semiconductor structure 102 and an upper semiconductor structure 104 arranged over the lower semiconductor structure 102. The semiconductor structures 102, 104 may correspond to, for example, BEOL metallization stacks of 2D ICs. In some embodiments, the semiconductor structures 102, 104 may respectively comprise integrated chip die arranged as separate tiers of a three-dimensional integrated chip (3D IC).

Dielectric layers 110, 112 corresponding to the semiconductor structures 102, 104 abut one another at the interface 108 to define a dielectric-to-dielectric bond 114 of the hybrid bond 106. In some embodiments, the dielectric-to-dielectric bond 114 is a fusion bond or an oxide-to-oxide bond. The dielectric layers 110, 112 may comprise, for example, one or more of silicon oxynitride, silicon dioxide, and silicon nitride. Further, the dielectric layers 110, 112 may correspond to, for example, dielectric layers of the BEOL metallization stacks, such as interlayer dielectric (ILD) layers and/or etch stop layers.

Copper features 116, 118 corresponding to the semiconductor structures 102, 104 are arranged in the dielectric layers 110, 112, and abut one another at the interface 108 to define a copper-to-copper bond 120 of the hybrid bond 106. In some embodiments, the copper features 116, 118 have widths tapering away from one another. Further, in some embodiments, the copper features 116, 118 have widths between about 0.5-2.0 micrometers. For example, the copper features 116, 118 may have widths of about 1.0 micrometers or about 1.5 micrometers. Even more, in some embodiments, the copper features 116, 118 have varying footprints and/or have centers that are laterally offset from one another. In such embodiments, the copper features 116, 118 abut the dielectric layers 110, 112 at the interface 108 to define a copper-to-dielectric bond 122 of the hybrid bond 106. The copper features 116, 118 may correspond to, for example, metal lines and/or bond pads of the BEOL metallization stacks.

At least one of the copper features 116, 118 is a copper alloy and, in some embodiments, both of the copper features 116, 118 are the copper alloy. For example, a lower copper feature 116 corresponding to the lower semiconductor structure 102 may be the copper alloy, and an upper copper feature 118 corresponding to the upper semiconductor structure 104 may be pure copper. The copper alloy has a reduced melting point, an increased resistance, and smaller grain sizes compared to pure copper. Further, the copper alloy is comprised of copper and a secondary metal.

The secondary metal has elevated concentrations along boundary regions 124 of the at least one copper-alloy feature, relative to interior regions of the at least one copper-alloy feature. In some embodiments, the secondary metal has an atomic weight less than that of copper, solubility in copper, and an atomic size difference with copper that is less than about 10% (e.g., about 2-8%). Further, in some embodiments, the secondary metal is the minority metal in the copper alloy by number of atoms or mass. For example, the secondary metal may make up less than about 50%, such as less than about 30%, 20%, 10%, or 1%, of the copper alloy by number of atoms or mass. The secondary metal may be, for example, aluminum, titanium, nickel, cobalt, manganese, zirconium, or hafnium. As will be further described hereafter, the secondary metal advantageously improves the strength and the reliability of the copper-to-copper bond 120 and any other bonds with the at least one copper-alloy feature, such as the copper-to-dielectric bond 122, by filling nanoscopic voids along the interface 108.

Diffusion barrier layers 126, 128 line and space the copper features 116, 118 from the dielectric layers 110, 112. The diffusion barrier layers 126, 128 are configured to prevent material from the copper features 116, 118 from diffusing to the dielectric layers 110, 112. The diffusion barrier layers 126, 128 abut one another, the dielectric layers 110, 112, and/or the copper features 116, 118. At the interface 108, the diffusion barrier layers 126, 128 may vertically abut a neighboring layer to define additional bonds 130 of the hybrid bond 106. The diffusion barrier layers 126, 128 may comprise, for example, one or more metals, such as tantalum nitride, tantalum, and titanium nitride. In some embodiments, the diffusion barrier layers 126, 128 each include a tantalum layer and a tantalum nitride layer stacked over the tantalum layer.

Figure 1B:
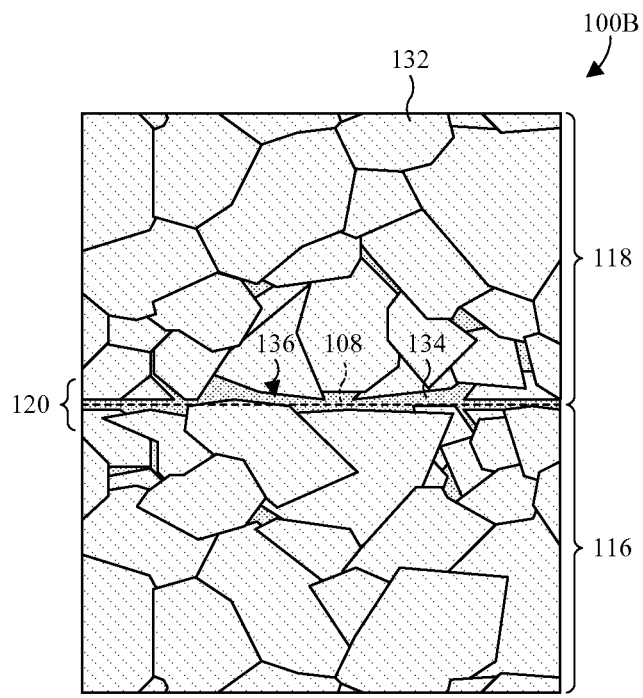
FIG. 1B illustrates a cross-sectional view of some embodiments of metal features bonded together by a copper-to-copper bond using copper alloys.

With reference to FIG. 1B, a cross-sectional view 100B of some embodiments of the copper features 116, 118 along the interface 108 is provided. The copper features 116, 118 include grains (i.e., crystallites) 132 of copper with varying sizes and orientations (i.e., are polycrystalline), and include precipitates 134 of the secondary metal. The copper grains 132 define the bodies of the copper features 116, 118, and define voids 136 along boundaries of the copper grains 132 and the interface 108. In some embodiments, at least some of the copper grains 132 have sizes less than those of pure copper. For example, copper grains in regions of the copper alloy may have dimensions of about 30-40 nanometers, such as about 35 nanometers, whereas copper grains in regions of pure copper may have dimensions of greater than about 40 nanometers, such as about 41 nanometers.

The precipitates 134 are dispersed throughout the bodies of the copper features 116, 118. Further, the precipitates 134 are concentrated at grain boundaries of the copper features 116, 118, and fill the voids 136 along the grain boundaries and the interface 108. By filling the voids 136, the strengths of the copper-to-copper bond 120 and the hybrid bond 106 (see FIG. 1A) are advantageously increased. Further, the process window for manufacturing the hybrid bond 106 is increased and manufacturing yields are increased.

Figure 2:
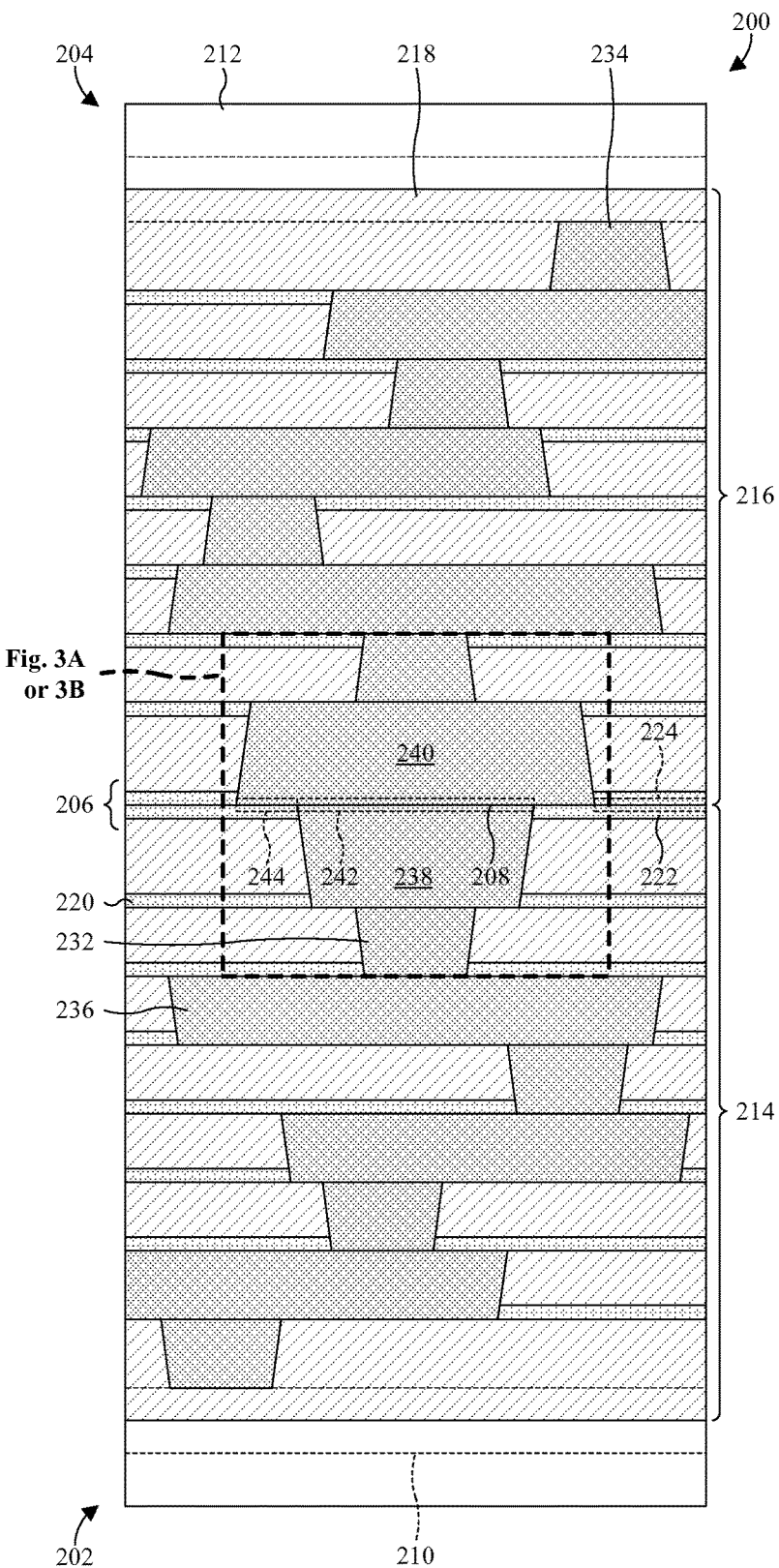
FIG. 2 illustrates a cross-sectional view of some embodiments of a three-dimensional (3D) integrated circuit (IC) comprising a pair of vertically stacked ICs bonded together by a copper-alloy based hybrid bond.

With reference to FIG. 2, a cross-sectional view 200 of some embodiments of a 3D IC comprising a pair of vertically stacked ICs 202, 204 bonded together by a copper-alloy based hybrid bond 206 is provided. The vertically stacked ICs 202, 204 are typically 2D ICs, and are bonded together by the copper-alloy based hybrid bond 206 at an interface 208 between the vertically stacked ICs 202, 204. The copper-alloy based hybrid bond 206 may be as described above in connection with FIGS. 1A & B. The vertically stacks ICs 202, 204 comprise corresponding device regions 210 stacked between corresponding semiconductor substrates 212 and corresponding BEOL metallization stacks 214, 216. The device regions 210 include electronic devices (not shown), such as transistors, photodiodes, etc. The semiconductor substrates 212 may be, for example, bulk semiconductor substrates, such as bulk silicon substrates, or silicon-on-insulator (SOI) substrates.

Stacks of dielectric layers corresponding to the BEOL metallization stacks 214, 216 abut one another at the interface 208 to define a dielectric-to-dielectric bond 224 of the hybrid bond 206. The stacks of dielectric layers include corresponding ILD layers 218, which may be, for example, a low κ dielectric, such as a dielectric with a dielectric constant less than about 3.9, or an oxide, such as silicon dioxide. Further, in some embodiments, the stacks of dielectric layers include corresponding etch stop layers 220 and/or corresponding bonding layers 222. The etch stop layers 220 may be, for example, arranged between the ILD layers 218. Further, the etch stop layers 220 may be, for example, a nitride, such as silicon oxynitride or silicon nitride. The bonding layers 222 are arranged at the interface 208 and may be, for example, silicon nitride, silicon oxynitride, or silicon dioxide.

Stacks of metal layers corresponding to the BEOL metallization stacks 214, 216 are arranged in the stacks of dielectric layers. The stacks of metal layers comprise vias 232, contacts 234, metal lines 236, and bond pads 238, 240. The vias 232 connect the metal lines 236 to one another and/or to the bond pads 238, 240, and the contacts 234 connect the metal lines 236 to the device regions 210. In some embodiments, the metal layers of the stacks of metal layers alternate between vias 232 or contacts 234, and metal lines 236 or bond pads 238, 240. Further, in some embodiments, the metal layers of the stacks of metal layers are lined by corresponding diffusion barrier layers (not shown) configured to prevent the diffusion of metal, such as copper. The stacks of metal layers further comprise corresponding copper features 238, 240 abutting one another at the interface 208 to define a copper-to-copper bond 242 of the hybrid bond 206.

In some embodiments, the copper features 238, 240 correspond to damascene or dual damascene structures, and/or to redistribution layers (RDLs) configured for bonding the vertically stacked ICs 202, 204 together. Further, in some embodiments, the copper features 238, 240 have widths of between about 0.5-2.0 micrometers, and/or are coupled to corresponding vias 232 having widths of about 0.1-1.0 micrometers. For example, a lower copper feature 238 may have a width of about 1 micrometer, an upper copper feature 240 may have a width of about 1.5 micrometers, and corresponding vias 232 of the lower and upper copper features 238, 240 may have widths of about 0.4 micrometers. Even more, in some embodiments, the copper features 238, 240 have differing footprints and/or centers that are laterally offset from one another. In such embodiments, the copper features 238, 240 may abut the stacks of dielectric layers at the interface 208 to define a copper-to-dielectric bond 244 of the hybrid bond 206.

At least one of the copper features 238, 240 is a copper alloy. The copper alloy has a reduced melting point, an increased resistance, and smaller grain sizes compared to pure copper. Further, the copper alloy is comprised of copper and a secondary metal. The secondary metal has elevated concentrations along boundary regions of the at least one copper-alloy feature, relative to interior regions. Further, in some embodiments, the secondary metal has an atomic weight less than that of copper, solubility in copper, and an atomic size difference with copper that is less than about 10%. In some embodiments, the secondary metal is the minority metal in the copper alloy by number of atoms or mass. The secondary metal may be, for example, aluminum, titanium, nickel, cobalt, manganese, zirconium, or hafnium. Advantageously, the secondary metal improves the strength and the reliability of the copper-to-copper bond 242 and any other bonds involving the at least one copper-alloy feature, such as the copper-to-dielectric bond 244, by filling nanoscopic voids along the interface 208.

Figure 3A:
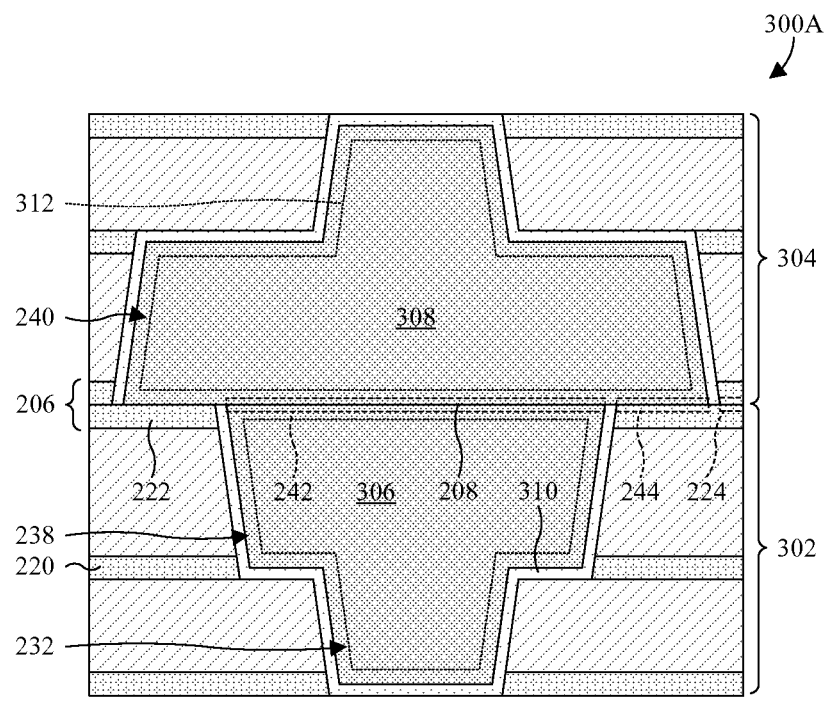
FIG. 3A illustrates a cross-sectional view of some embodiments of a pair of dual damascene structures comprising corresponding copper features in the 3D IC of FIG. 2.

With reference to FIG. 3A, a cross-sectional view 300A of some embodiments of a pair of dual damascene structures 302, 304 bonded together by the copper-to-copper bond 242 is provided. The dual damascene structures 302, 304 correspond to the BEOL metallization stacks 214, 216 (see FIG. 2), and abut at the interface 208. The dual damascene structures 302, 304 comprise corresponding copper layers 306, 308 and corresponding diffusion barrier layers 310. The copper layers 306, 308 and the diffusion barrier layers 310 are arranged in the stacks of dielectric layers. The copper layers 306, 308 comprise corresponding pairs of vias 232 and bond pads 238, 240 abutting the vias 232. At least one of the copper layers 306, 308 is the copper alloy, and has increased concentrations of the secondary metal along boundary regions 312. The diffusion barrier layers 310 extend continuously along sidewall surfaces of the vias 232 and the bond pads 238, 240, so that the diffusion barrier layers 310 line the copper layers 306, 308 to space the copper layers 306, 308 from the stacks of dielectric layers.

Figure 3B:
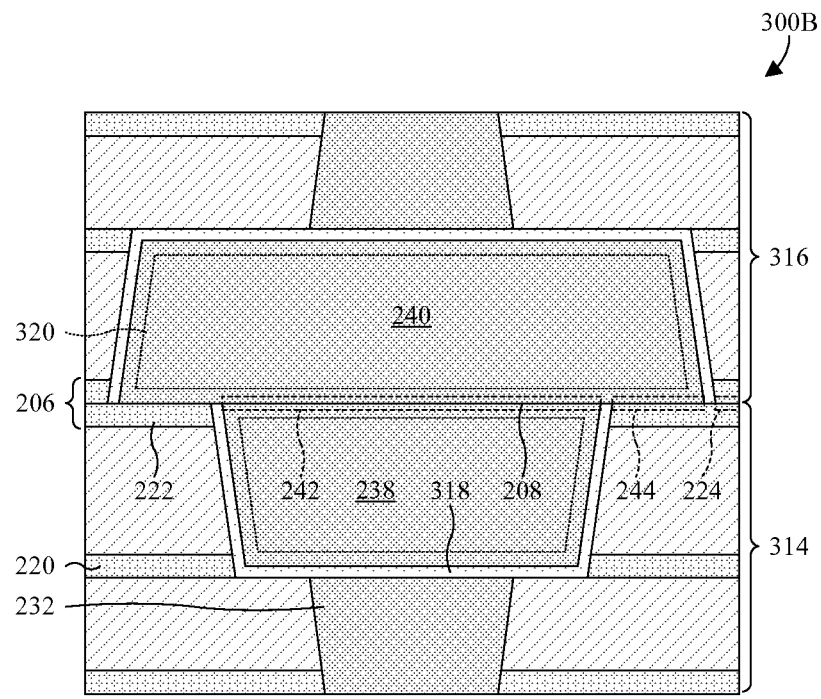
FIG. 3B illustrates a cross-sectional view of some embodiments of a pair of damascene structures comprising corresponding copper features in the 3D IC of FIG. 2.

With reference to FIG. 3B, a cross-sectional view 300B of some embodiments of a pair of damascene structures 314, 316 bonded together by the copper-to-copper bond 242 is provided. The damascene structures 314, 316 correspond to the BEOL metallization stacks 214, 216 (see FIG. 2), and abut at the interface 208. The damascene structures 314, 316 comprise corresponding bond pads 238, 240 and corresponding diffusion barrier layers 318. The bond pads 238, 240 and the diffusion barrier layers 318 are buried in the stacks of dielectric layers. The bond pads 238, 240 are vertically separated from adjacent vias 232 by way of the diffusion barrier layers 318, which extend laterally along a surface of the bond pads 238, 240 opposing the interface 108 between the bond pads 238, 240 and the vias 232. At least one of the bond pads 238, 240 is the copper alloy, and has increased concentrations of the secondary metal along boundary regions 320. The diffusion barrier layers 318 line the bond pads 238, 240 to space the bond pads 238, 240 from the stacks of dielectric layers.

Figure 4:
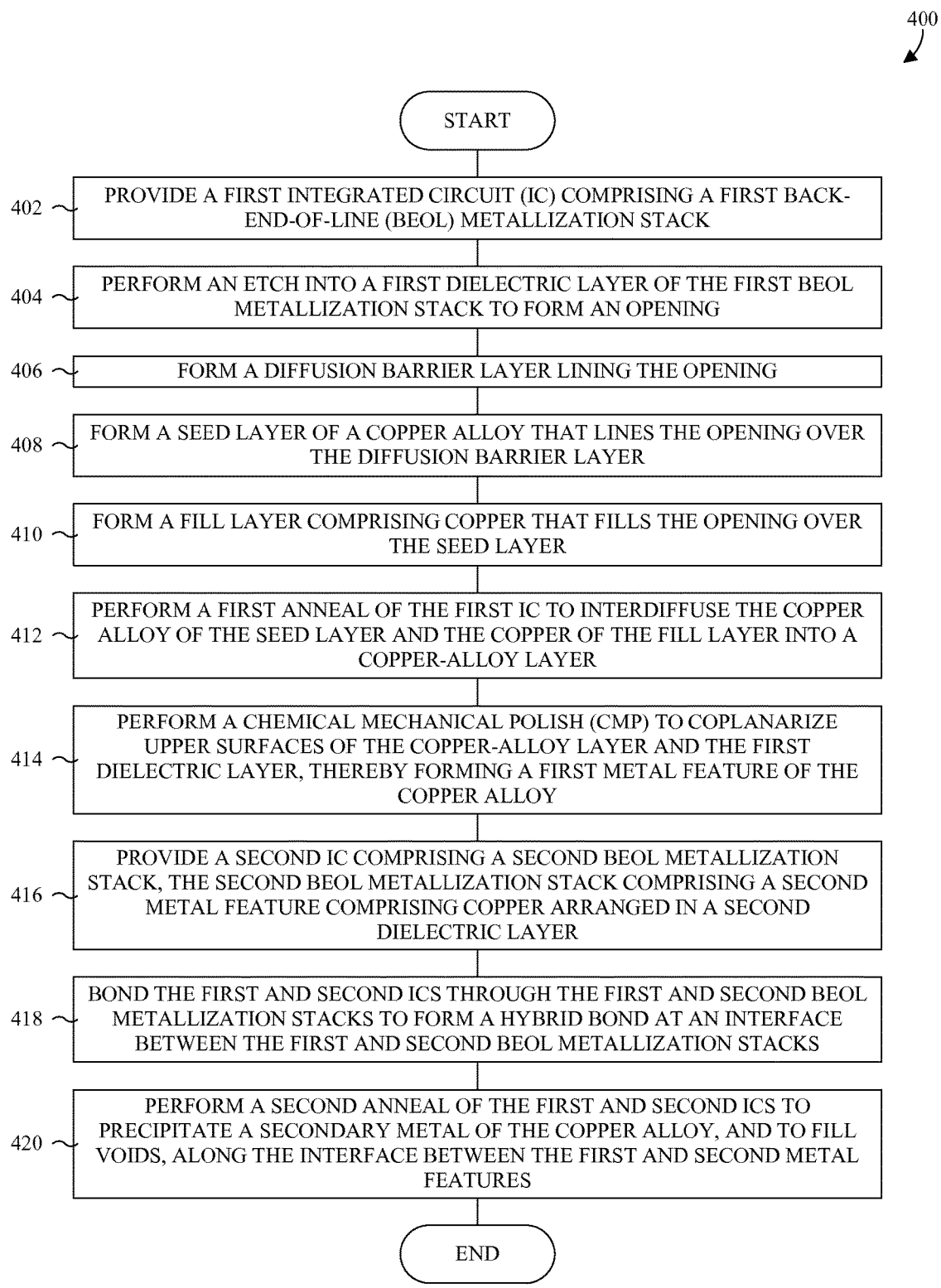
FIG. 4 illustrates a flowchart of some embodiments of a method for bonding a pair of ICs into a 3D IC using a copper-alloy based hybrid bond.

With reference to FIG. 4, a flowchart 400 provides some embodiments of a method for bonding a pair of ICs into a 3D IC using a copper-alloy based hybrid bond.

At 402, a first IC comprising a first BEOL metallization stack is provided.

At 404, a first etch is performed into a first dielectric layer of the first BEOL metallization stack to form an opening. Typically, the opening exposes a metal feature, such as a metal line, of the BEOL metallization stack.

At 406, a diffusion barrier layer is formed lining the opening.

At 408, a seed layer is formed of a copper alloy and lining the opening over the diffusion barrier layer. The copper alloy comprises copper and a secondary metal. In some embodiments, the secondary metal may have an atomic weight less than that of copper, solubility in copper, and an atomic size difference with copper that is less than about 10%.

At 410, a fill layer is formed comprising copper and filling the opening over the seed layer.

At 412, a first anneal of the first IC is performed to interdiffuse the copper alloy of the seed layer and the copper of the fill layer, thereby integrating the seed and fill layers into a copper-alloy layer comprising copper and the secondary metal.

At 414, a chemical mechanical polish (CMP) is performed to coplanarize upper surfaces of the copper-alloy layer and the first dielectric layer, thereby forming a first metal feature of the copper alloy.

At 416, a second IC comprising a second BEOL metallization stack is provided. The second BEOL metallization stack comprises a second dielectric layer and a second metal feature comprising copper arranged in the second dielectric layer. In some embodiments, the second metal feature is pure copper or a copper alloy. Further, in some embodiments, the second metal feature is formed in the same manner as the first metal feature (i.e., Acts 402-414 are performed for the second IC).

At 418, the first and second ICs are bonded through the first and second BEOL metallization stacks to form a hybrid bond at an interface between the first and second BEOL metallization stacks. The hybrid bond comprises a dielectric-to-dielectric bond between the first and second dielectric layers, and comprises a copper-to-copper bond between the first and second metal features. The dielectric-to-dielectric bonds and copper-to-copper bonds may be formed using known bonding processes, such as fusion bonding processes and/or metallic bonding processes.

At 420, a second anneal of the first and second ICs is performed to precipitate the secondary metal, and to fill voids, along the interface between the first and second metal features. In some embodiments, such as where the first and second metal features have different footprints and/or centers that are laterally offset relative to one another, the secondary metal also precipitates and fills voids along the interface between the first or second metal feature and the opposing dielectric layer. Filling the voids with precipitates of the secondary metal advantageously improves the strength and the reliability of the copper-to-copper bond and, in some embodiments, a copper-to-dielectric bond. This, in turn, increases the size of the manufacturing process window and increases yield according to WAT.

In alternative embodiments, the first anneal of Act 412 is omitted. In such embodiments, the seed layer and the fill layer interdiffuse during the second anneal of Act 420, thereby integrating the seed and fill layers into the copper-alloy layer.

The method may be carried out at the wafer and/or the die level. For example, the first IC may be integrated into a wafer, whereas the second IC may be singulated. As another example, the first IC may be integrated in a first wafer and the second IC may be integrated into a second wafer. As yet another example, the first IC may be singulated and the second IC may be singulated. Where the wafer level is involved (i.e., the first or second IC is integrated into a wafer at the time of performing the method), singulation may be performed after the second anneal to singulate 3D ICs resulting from the method.

Further, while the disclosed method (e.g., the method described by the flowchart 400) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 5-12, cross-sectional views of some embodiments of a 3D IC having a copper-alloy based hybrid bond at various stages of manufacture are provided to illustrate the method of FIG. 4. Although FIGS. 5-12 are described in relation to the method of FIG. 4, it will be appreciated that the structures disclosed in FIGS. 5-12 are not limited to the method of FIG. 4, but instead may stand alone as structures independent of the method of FIG. 4. Similarly, although the method of FIG. 4 is described in relation to FIGS. 5-12, it will be appreciated that the method of FIG. 4 is not limited to the structures disclosed in FIGS. 5-12, but instead may stand alone independent of the structures disclosed in FIGS. 5-12.

Figure 5:
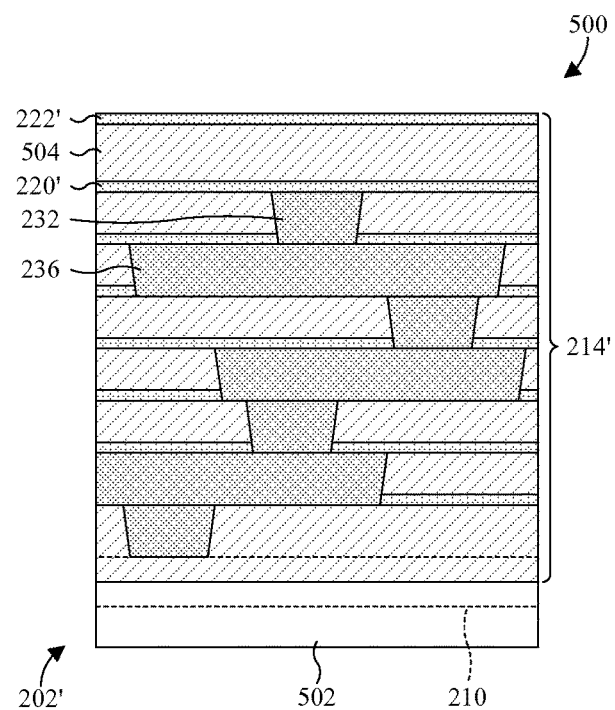
FIGS. 5-12 illustrate a series of cross-sectional views at various stages of the method of FIG. 4.

FIG. 5 illustrates a cross-sectional view 500 of some embodiments corresponding to Act 402. As illustrated, a first IC 202' is provided. The first IC 202' comprises a device region 210 vertically stacked between a BEOL metallization stack 214' and a semiconductor substrate 502. The BEOL metallization stack 214' includes a stack of dielectric layers and a stack of metal layers arranged in the stack of dielectric layers. The stack of dielectric layers comprise ILD layers 504 and, in some embodiments, etch stop layers 220' and/or a bonding layer 222'. The etch stop layers 220' are arranged between the ILD layers 504 and the device region 210, and the bonding layer 222' extends laterally along a top surface of the BEOL metallization stack 214'. The stack of metal layers comprises metal features, such as vias 232, contacts, metal lines 236, and bond pads.

Figure 6:
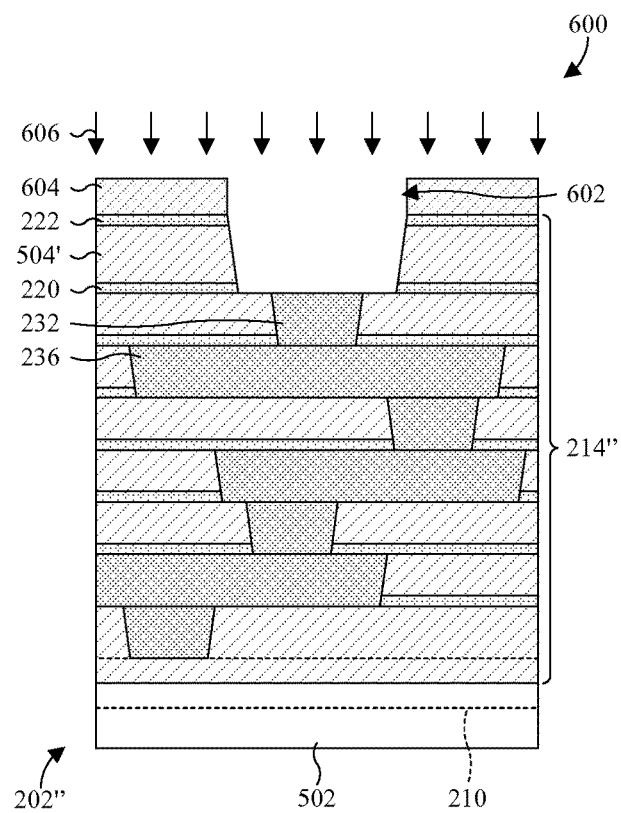

FIG. 6 illustrates a cross-sectional view 600 of some embodiments corresponding to Act 404. As illustrated, an etch is performed into the dielectric layers 220', 222', 504 (see FIG. 5) to form an opening 602 in remaining dielectric layers 220, 222, 504' of a BEOL metallization stack 214" of an IC 202". In some embodiments, the etch is performed into the bonding layer 222' (see FIG. 5), a topmost ILD layer 504 (see FIG. 5), and a topmost etch stop layer 220' (see FIG. 5). The opening 602 exposes a via 232 of the stack of metal layers and, in some embodiments, has a width of about 0.5-2.0 micrometers, such as about 1.0 micrometer. In some embodiments, the opening 602 may, as illustrated, correspond to a damascene structure. In alternative embodiments, the opening 602 may correspond to a dual damascene structure. Where the opening 602 corresponds to a dual damascene structure, the opening 602 includes the space occupied by the via 232, such that the via 232 is omitted in FIG. 5.

The process for performing the etch may comprise forming a photoresist layer 604 masking regions of the dielectric layers 220', 222', 504 surrounding the opening 602. One or more etchants 606 may then be sequentially applied to the dielectric layers 220', 222', 504 according to a pattern of the photoresist layer 604, thereby defining the opening 602. Where the dielectric layers 220', 222', 504 includes etch stop layers 220' and/or a bonding layer 222', the etchant(s) 606 typically comprise multiple types of etchants. After applying the etchant(s) 606, the photoresist layer 604 may be removed.

Figure 7:
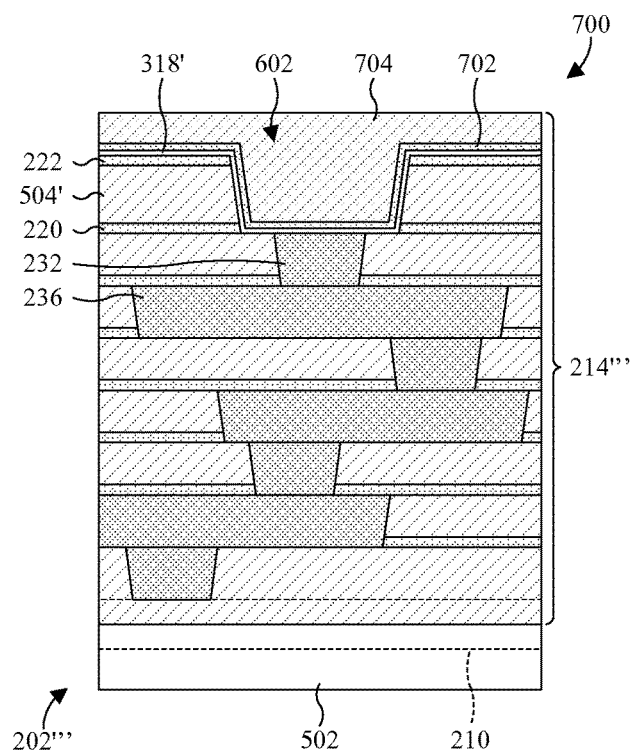

FIG. 7 illustrates a cross-sectional view 700 of some embodiments corresponding to Acts 406, 408, 410. As illustrated, a diffusion barrier layer 318' is formed lining the opening 602. The diffusion barrier layer 318' is formed of one or more materials configured to individually or collectively prevent the diffusion of copper into the dielectric layers 220, 222, 504'. In some embodiments, the diffusion barrier layer 318' is formed of a tantalum nitride layer and tantalum layer overlying the tantalum nitride layer. Further, in some embodiments, the diffusion barrier layer 318' is formed using a vapor deposition technique and/or a conformal deposition technique, such as physical vapor deposition (PVD).

Also illustrated by FIG. 7, a seed layer 702 is formed lining the opening 602 over the diffusion barrier layer 318'. The seed layer 702 is formed of a copper alloy and, in some embodiments, is formed using a vapor deposition technique and/or a conformal deposition technique, such as PVD. The copper alloy has a reduced melting point, an increased resistance, and smaller grain (i.e., crystallite) sizes compared to pure copper. Further, the copper alloy is comprised of copper and a secondary metal. In some embodiments, the secondary metal has an atomic weight less than that of copper, solubility in copper, and an atomic size difference with copper that is less than about 10%. The secondary metal may be, for example, aluminum, titanium, nickel, cobalt, manganese, zirconium, or hafnium. In some embodiments, 0.5% of the weight of the copper alloy is aluminum, and the remainder of the weight of the copper alloy is copper.

Also illustrated by FIG. 7, a fill layer 704 is formed of copper, such as pure copper, filling the opening 602 over the seed layer 702. In some embodiments, the fill layer 704 is formed by electrochemical deposition (ECD). Formation of the fill layer 704, together with the seed layer 702 and the diffusion barrier layer 318', results in an IC 202''' with an enlarged BEOL metallization 214''', relative to FIG. 6.

Figure 8:
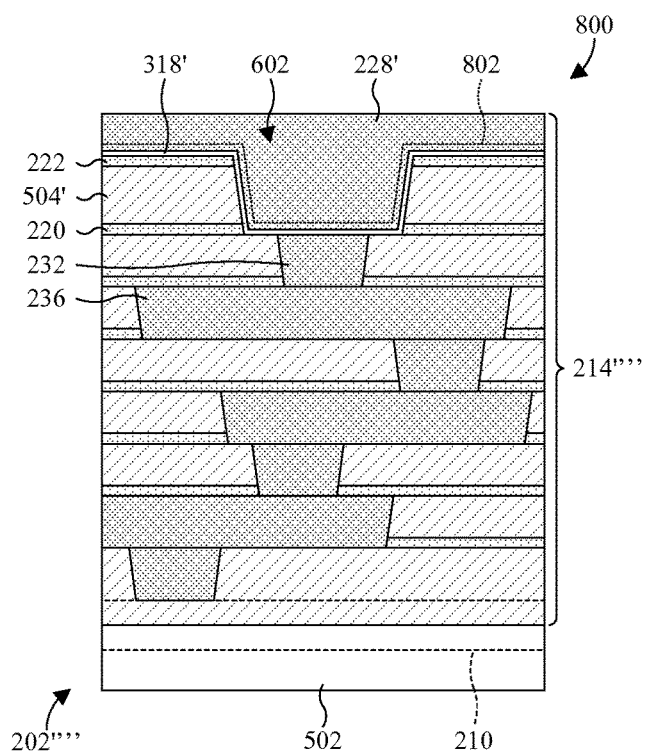

FIG. 8 illustrates a cross-sectional view 800 of some embodiments corresponding to Act 412. As illustrated, a first anneal is performed to the first IC 202''' (see FIG. 7) to interdiffuse the copper alloy of the seed layer 702 (see FIG. 7) with the copper of the fill layer 704 (see FIG. 7). The first anneal results in a BEOL metallization stack 214'''' of an IC 202'''' that comprises a copper-alloy layer 228'. The copper-alloy layer 228' integrates both the seed layer 702 and the fill layer 704, and has increased concentrations of the secondary metal along boundary regions 802 where the seed layer 702 was. In some embodiments, the first anneal is performed by heating the first IC 202''' to between about 300-400 degrees Celsius, such as about 350 degrees Celsius or about 340-360 degrees Celsius.

Figure 9:
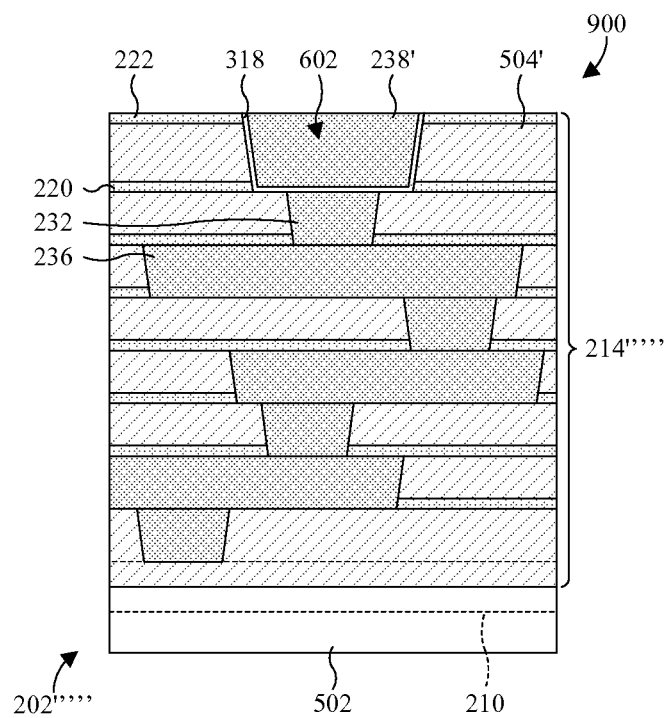

FIG. 9 illustrates a cross-sectional view 900 of some embodiments corresponding to Act 414. As illustrated, a CMP is performed into the diffusion barrier layer 318' (see FIG. 8) and the copper-alloy layer 228' (see FIG. 8). The CMP coplanarizes upper surfaces of the copper-alloy layer 228', the diffusion barrier layer 318', and the stack of dielectric layers 220, 222, 504'. Further, the CMP results in a BEOL metallization stack 214'''' of an IC 202'''' that comprises one or more first metal features 238' in the opening 602, lined by a remaining diffusion barrier layer 318. Where the opening 602 corresponds to a damascene structure, as illustrated, a single metal feature 238' is formed in the opening 602. Where the opening 602 corresponds to a dual damascene structure, two metal features are formed in the opening 602.

Figure 10:
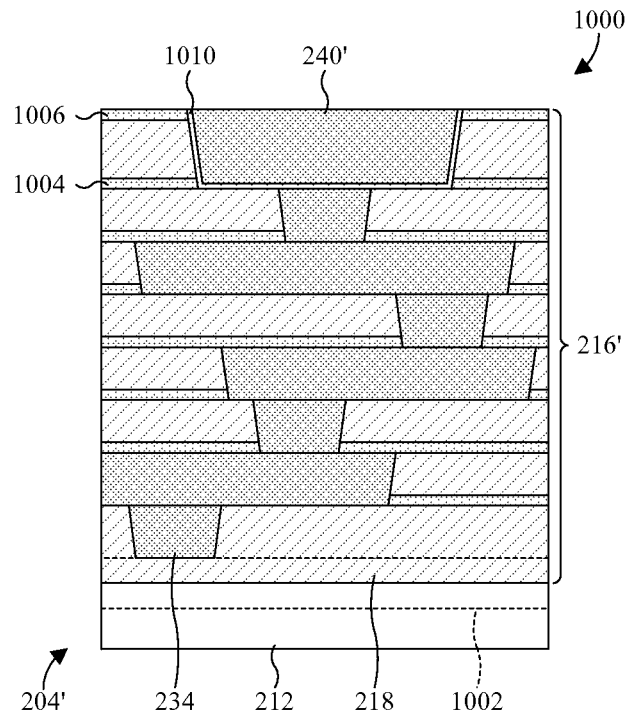

FIG. 10 illustrates a cross-sectional view 1000 of some embodiments corresponding to Act 416. As illustrated, a second IC 204' is provided. The second IC 204' comprises a device region 1002 vertically stacked between a BEOL metallization stack 216' and a semiconductor substrate 212. The BEOL metallization stack 216' includes a stack of dielectric layers and a stack of metal layers arranged in the stack of dielectric layers. The stack of dielectric layers comprise ILD layers 218 and, in some embodiments, etch stop layers 1004 and/or a bonding layer 1006. The etch stop layers 1004 are arranged between the ILD layers 218 and the device region 1002, and the bonding layer 1006 extends laterally along a top surface of the BEOL metallization stack 216'. The stack of metal layers comprises vias, contacts 234, metal lines, and bond pads 240'. Further, the stack of metal layers comprise a second metal feature 240' having an upper surface substantially coplanar with an upper surface of the stack of dielectric layers. In some embodiments, the second metal feature 240' is formed by performing Acts 402-414 with the second IC 204'. The metal features 234, 240' are lined by corresponding diffusion barrier layers 1010.

Figure 11:
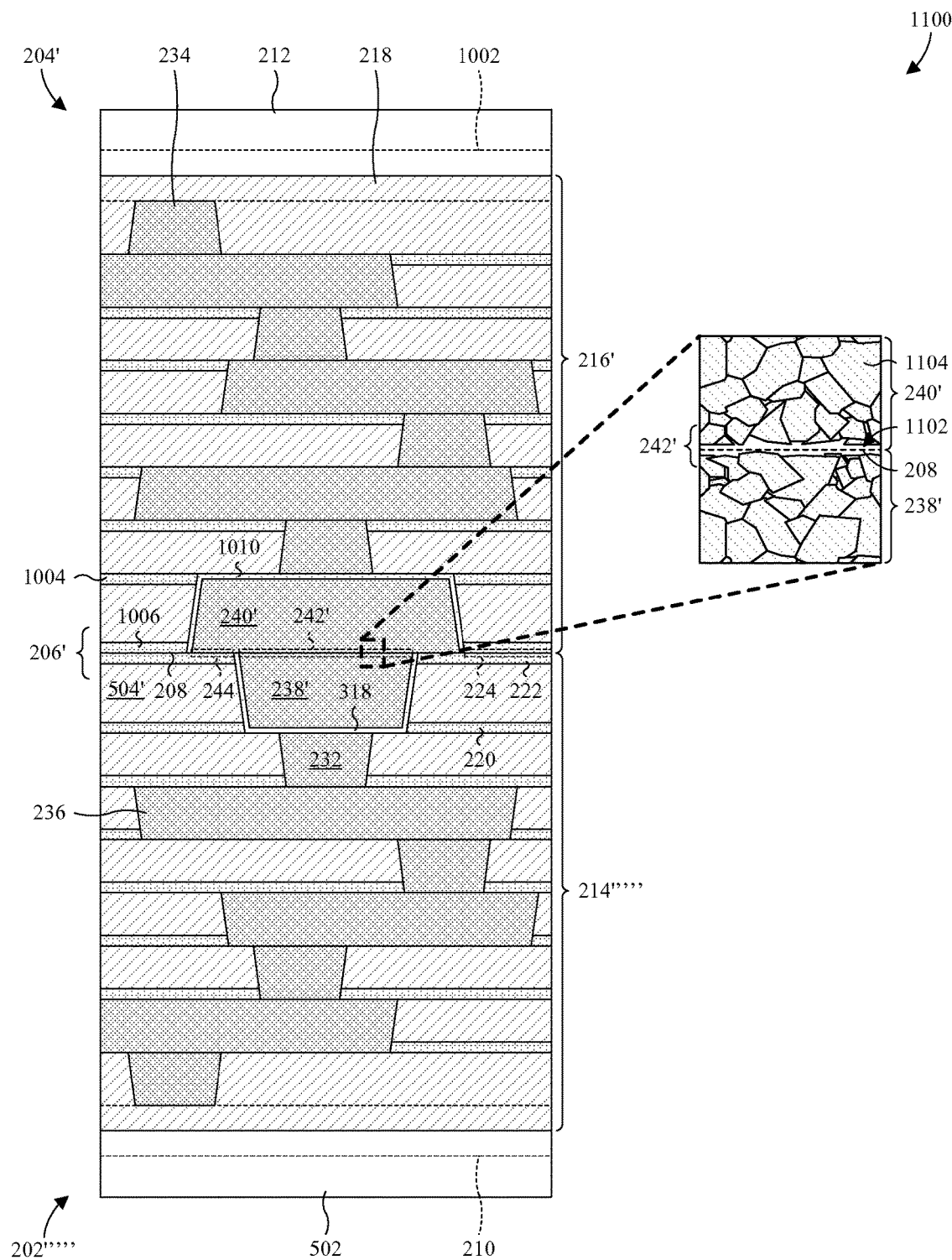

FIG. 11 illustrates a cross-sectional view 1100 of some embodiments corresponding to Act 418. As illustrated, the first and second ICs 202'''', 204' are bonded through the corresponding BEOL metallization stacks 214'''', 216' to form a hybrid bond 206' at an interface 208 between the BEOL metallization stacks 214'''', 216'. The hybrid bond 206' comprises a dielectric-to-dielectric bond 224 at the interface 208, between the stacks of dielectric layers corresponding to the BEOL metallization stacks 214'''', 216'. Further, the hybrid bond 206' comprises a copper-to-copper bond 242' at the interface 208, between the first and second metal features 238', 240'. In some embodiments, such as where the first and second metal features 238', 240' have different footprints and/or centers that are laterally offset from one another, the hybrid bond 206' comprises additional bonds, such as a copper-to-dielectric bond 244' at the interface 208, between the first or second metal feature 238', 240' and the opposing stack of dielectric layers. The process for bonding the first and second ICs 202'''', 204' may include conventional bonding processes, such as fusion bonding and/or metallic bonding.

After forming the hybrid bond 206', nanoscopic voids 1102 exist along the interface 208, between the first and second metal features 238', 240', and along boundaries of copper grains 1104 in the first and second metal features 238', 240'. The voids 1102 reduce the strength and the reliability of the copper-to-copper bond 242' and the hybrid bond 206'. Further, the voids 1102 reduce the size of the manufacturing process window and the manufacturing yield according to WAT. To address these challenges, a second anneal is performed to precipitate the secondary metal of the first and second metal features 238', 240' in the voids 1102 and to fill the voids 1102.

Figure 12:
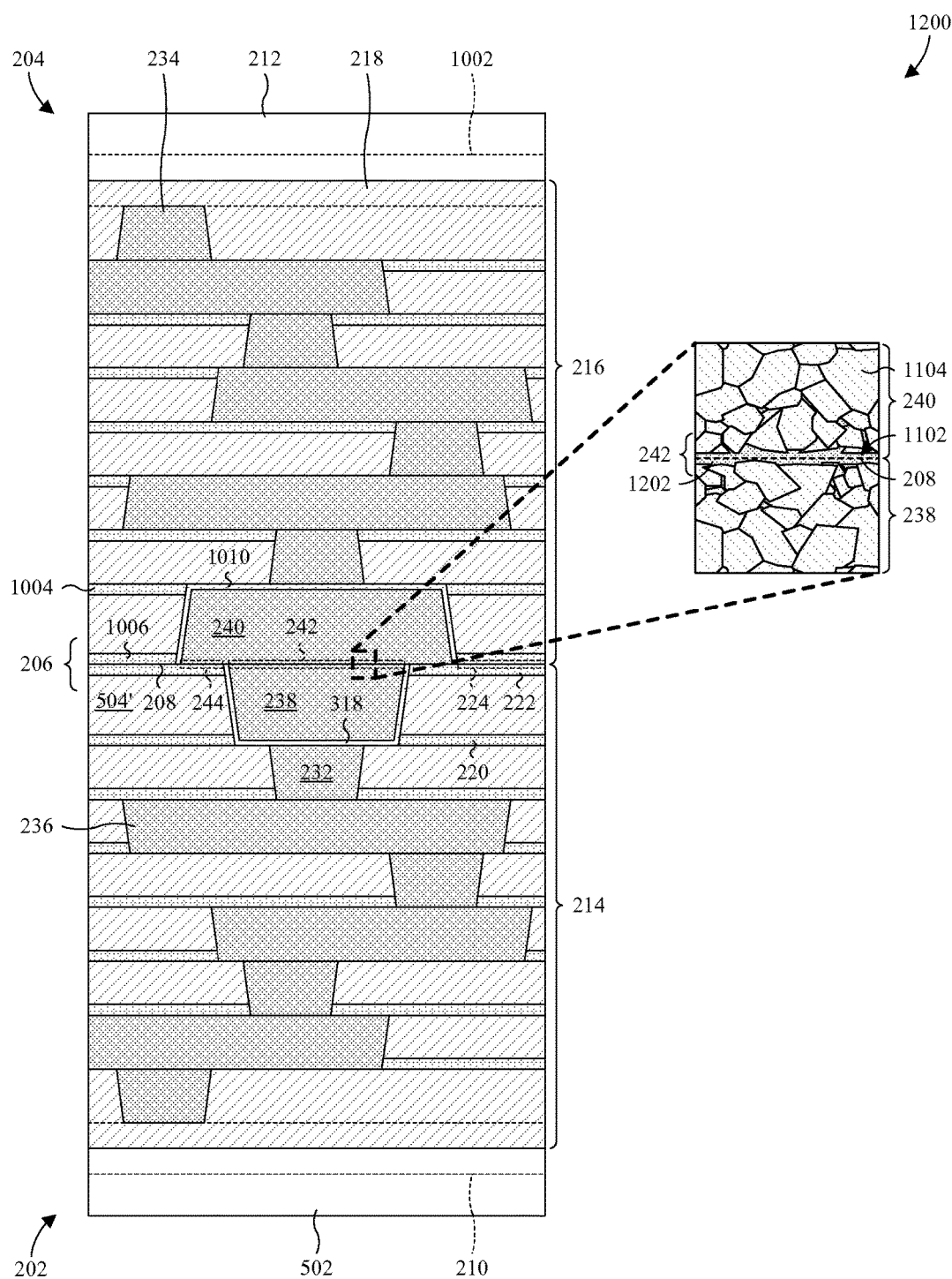

FIG. 12 illustrates a cross-sectional view 1200 of some embodiments corresponding to Act 420. As illustrated, a second anneal is performed on the first and second ICs 202'''', 204' (see FIG. 11). In some embodiments, the second anneal is performed by heating the first and second ICs 202'''', 204' to between about 300-400 degrees Celsius, such as about 350 degrees Celsius. The second anneal causes the secondary metal to precipitate and fill 1102 voids along the interface 208, between the first and second metal features 238', 240' (see FIG. 11). Further, in some embodiments, the second anneal causes the secondary metal to precipitate and fill voids 1102 along the interface 208, between the first or second feature 238', 240' and the opposing stack of dielectric layers.

Upon completion of the second anneal, precipitates 1202 fill the voids 1102 and regions of the first and second metal features 238, 240 abutting the interface 208 have increased concentrations of the secondary metal, relative to interior regions. Further, the strength of the resulting hybrid bond 206 is advantageously improved by filling the voids 1102.

Thus, as can be appreciated from above, the present disclosure provides an IC. The IC comprises a pair of semiconductor structures vertically stacked upon one another. The pair of semiconductor structures comprise corresponding dielectric layers and corresponding metal features arranged in the dielectric layers. The metal features comprise a copper alloy having copper and a secondary metal. The IC further comprises a hybrid bond arranged at an interface between the semiconductor structures. The hybrid bond comprises a first bond bonding the dielectric layers together and a second bond bonding the metal features together. The second bond comprises voids arranged between copper grains of the metal features and filled by the secondary metal.

In other embodiments, the present disclosure provides a method for bonding a pair of semiconductor structures together. A pair of semiconductor structures comprising corresponding dielectric layers and corresponding metal features arranged in the dielectric layers are provided. The metal features comprise a copper alloy having copper and a secondary metal. The semiconductor structures are bonded together to form a hybrid bond at an interface between the semiconductor structures. The hybrid bond comprises a first bond bonding the dielectric layers together and a second bond bonding the metal features together. The second bond comprises voids arranged between copper grains of the metal features. An anneal is performed to the hybrid bond to form regions of the secondary metal along boundaries of the copper grains and to fill the voids with the secondary metal.

In yet other embodiments, the present disclosure provides a 3D IC. The 3D IC comprises a first IC chip die having a first plurality of metal interconnect layers coupled to a first metal feature arranged within a first ILD layer. The first metal feature comprises a copper alloy having copper and a secondary metal. The 3D IC further comprises a second IC die having a second plurality of metal interconnect layers coupled to a second metal feature arranged within a second ILD layer. The second metal feature comprises copper. The first metal feature contacts the second metal feature along an interface comprising the first ILD layer and the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for bonding a pair of semiconductor structures together, the method comprising:
   providing a pair of semiconductor structures comprising corresponding dielectric layers and corresponding metal features arranged in the dielectric layers, wherein the metal features comprise a copper alloy having copper and a secondary metal, and wherein the metal features comprise a metal feature of the copper alloy;
   bonding the semiconductor structures together to form a hybrid bond at an interface between the semiconductor structures, the hybrid bond comprising a first bond bonding the dielectric layers together, a second bond bonding the metal features together, and a third bond bonding one of the dielectric layers to the metal feature, and wherein the second bond comprises voids arranged between copper grains of the metal features; and
   performing an anneal to the hybrid bond to form regions of the secondary metal along boundaries of the copper grains, to fill the voids with the secondary metal, and to fill additional voids of the third bond with the secondary metal.

2. The method according to claim 1, wherein the metal features comprise a second metal feature of pure copper, and wherein the bonding the semiconductor structures together comprises:
   bonding the metal feature to the second metal feature with the second bond.

3. The method according to claim 1, further comprising:
   forming the copper alloy with a secondary metal that has an atomic weight less than that of copper, solubility in copper, and an atomic size difference with copper that is less than about 10%.

4. The method according to claim 1, further comprising:
   forming the copper alloy with a secondary metal of aluminum, titanium, nickel, cobalt, manganese, zirconium, or hafnium.

5. The method according to claim 1, wherein the providing the pair of semiconductor structures comprises:
   providing a semiconductor structure comprising a dielectric layer;
   performing an etch into the dielectric layer to form an opening for the metal feature;
   forming a diffusion barrier layer lining the opening;
   forming a seed layer of the copper alloy lining the opening over the diffusion barrier layer;
   forming a fill layer of copper filling the opening over the seed layer; and
   performing a chemical mechanical polish (CMP) into the diffusion barrier layer, the seed layer, and the fill layer to coplanarize upper surfaces of the diffusion barrier layer, the seed layer, and the fill layer with an upper surface of the dielectric layer, and to form the metal feature.

6. The method according to claim 5, further comprising:
   before the performing the CMP, performing a second anneal of the seed layer and the fill layer to interdiffuse the copper alloy of the seed layer with the copper of the fill layer.

7. The method according to claim 5, further comprising:
   performing the etch into the dielectric layer to form the opening for a pair of metal features of a dual damascene structure; and
   performing the CMP into the diffusion barrier layer, the seed layer, and the fill layer to form the pair of metal features for the dual damascene structure.

8. The method according to claim 1, further comprising:
   forming the dielectric layers of silicon oxynitride, oxide, or silicon nitride.

9. The method according to claim 1, wherein the semiconductor structures are integrated circuits, and wherein the method further comprises:
   bonding the semiconductor structures together through corresponding back end of line (BEOL) metallization stacks to form the hybrid bond.

10. A method for bonding a pair of semiconductor structures together, the method comprising:
    providing a pair of semiconductor structures comprising dielectric layers and metal features arranged in the dielectric layers, wherein the metal features comprise a primary metal that is pure, and wherein at least one of the metal features is a metal alloy, comprising the primary metal and a secondary metal; and
    forming a hybrid bond interface between the semiconductor structures, wherein the forming the hybrid bond interface comprises forming a first bond interface between the dielectric layers, and further forming a second bond interface between the metal features, and wherein the second bond interface is formed with the secondary metal filling voids between metal grains of the metal features;
    wherein the providing the pair of semiconductor structures comprises:
    performing an etch into a first dielectric layer of the dielectric layers to form an opening for a first metal feature of the metal features;
    forming a seed layer of the metal alloy lining the opening;
    forming a fill layer of the primary metal filling the opening over the seed layer;
    performing an anneal of the seed and fill layers to interdiffuse the seed and fill layers, such that the fill layer becomes the metal alloy; and
    performing a chemical mechanical polish (CMP) into the interdiffused seed and fill layers to form the first metal feature.

11. The method according to claim 10, wherein the primary metal is pure copper, and wherein the secondary metal has an atomic weight less than that of copper, solubility in copper, and an atomic size difference with copper that is less than about 10%.

12. The method according to claim 10, wherein the forming the second bond interface comprises:
    bonding the metal features together using a metallic bonding process, wherein the voids are unfilled after the bonding; and performing an anneal to the metal features to form precipitates of the secondary metal from the metal alloy, wherein the precipitates are formed filling the voids.

13. The method according to claim 12, wherein the precipitates are formed with an elevated concentration at the second bond interface relative to interiors of the metal features.

14. The method according to claim 10, wherein the providing the pair of semiconductor structures comprises:
   forming a diffusion barrier layer lining the opening, wherein the seed layer is formed lining the opening over the diffusion barrier layer, wherein the CMP is further performed into the diffusion barrier layer, wherein the CMP coplanarizes upper surfaces respectively of the diffusion barrier layer, the seed layer, and the fill layer with an upper surface of the first dielectric layer, and wherein the primary metal is pure copper.

15. The method according to claim 14, wherein the providing the pair of semiconductor structures further comprises:
   forming the first dielectric layer covering a semiconductor substrate and a device region, wherein the device region is arranged over and within the semiconductor substrate; and
   forming an alternating stack of metal lines and vias overlying the semiconductor substrate and the device region, and within the first dielectric layer, while forming the first dielectric layer, wherein the seed and fill layers are formed electrically coupled to the device region through the metal lines and the vias.

16. The method according to claim 10, wherein the forming the hybrid bond interface further comprises:
   forming a third bond interface between the at least one of the metal features and the dielectric layers, wherein the third bond interface is formed with the secondary metal filling additional voids between the at least one of the metal features and the dielectric layers.

17. The method according to claim 16, wherein the forming the third bond interface comprises:
   performing an anneal to the at least one of the metal features to form precipitates of the secondary metal from the metal alloy, wherein the precipitates are formed filling the additional voids.

18. The method according to claim 10, wherein the providing the pair of semiconductor structures comprises forming the pair of semiconductor structures as integrated circuit (ICs), and wherein the forming the hybrid bond interface comprises bonding the pair of semiconductor structures together through respective back-end-of-line (BEOL) interconnect structures.

19. A method for bonding a pair of integrated circuits (ICs) together, the method comprising:
   providing a first IC and a second IC, wherein the first and second ICs comprise individual back-end-of-line (BEOL) interconnect structures overlying individual semiconductor substrates;
   forming a first metal feature and a second metal feature respectively in the BEOL interconnect structures of the first and second ICs, wherein the first metal feature is copper alloy, wherein the second metal feature is pure copper, and wherein the copper alloy comprises a primary metal of copper and a secondary metal different than copper;
   hybrid bonding the first and second ICs together through the BEOL interconnect structures, wherein the hybrid bonding the first and second ICs together comprises bonding dielectric layers individual to the first and second ICs together, and further bonding the first and second metal features together, and wherein the bonding the first and second metal features together results in voids between the first and second metal features; and
   performing an anneal to the first and second ICs to form precipitates of the secondary metal from the copper alloy, wherein the precipitates are formed filling the voids between the first and second metal features.

20. The method according to claim 19, wherein the hybrid bonding further comprises bonding one of the dielectric layers to the first metal feature, and wherein the precipitates are further formed filling additional voids between the one of the dielectric layers and the first metal feature.

* * * * *